United States Patent [19]
Godinho et al.

[11] Patent Number: 5,656,861
[45] Date of Patent: *Aug. 12, 1997

[54] SELF-ALIGNING CONTACT AND INTERCONNECT STRUCTURE

[75] Inventors: Norman Godinho, Los Altos Hills; Tsu-Wei Frank Lee, Monte Sereno; Hsiang-Wen Chen, Cupertino; Richard F. Motta, Los Altos; Juine-Kai Tsang, Palo Alto; Joseph Tzou, Belmont; Jai-Man Baik, San Jose; Ting-Pwu Yen, Fremont, all of Calif.

[73] Assignee: Paradigm Technology, Inc., San Jose, Calif.

[*] Notice: The term of this patent shall not extend beyond the expiration date of Pat. No. 5,124,774.

[21] Appl. No.: 450,847

[22] Filed: May 25, 1995

Related U.S. Application Data

[60] Continuation of Ser. No. 953,410, Sep. 28, 1992, Pat. No. 5,483,104, which is a division of Ser. No. 743,008, Aug. 9, 1991, abandoned, which is a continuation-in-part of Ser. No. 555,559, Jul. 19, 1990, Pat. No. 5,124,774, which is a continuation-in-part of Ser. No. 464,496, Jan. 12, 1990, Pat. No. 5,166,771.

[51] Int. Cl.⁶ .................................................. H01L 23/48
[52] U.S. Cl. ........................ 257/758; 257/382; 257/774; 257/900; 257/904
[58] Field of Search .................................. 257/758, 382, 257/401, 754, 773, 774, 776, 900, 903, 904

[56] References Cited

U.S. PATENT DOCUMENTS

| | | | |
|---|---|---|---|
| 4,103,415 | 8/1978 | Hayes | 29/571 |
| 4,325,169 | 4/1982 | Ponder et al. | 29/571 |
| 4,409,319 | 10/1983 | Colacino et al. | 430/296 |
| 4,466,172 | 8/1984 | Batra | 29/571 |

(List continued on next page.)

FOREIGN PATENT DOCUMENTS

| | | |
|---|---|---|
| 0252206 | 1/1988 | European Pat. Off. |
| 0326293 | 8/1989 | European Pat. Off. |
| 59-175162 | 10/1984 | Japan. |
| 61-248472 | 11/1986 | Japan. |
| 62-219558 | 9/1987 | Japan. |
| 1-14940 | 1/1989 | Japan. |
| 1-47053 | 2/1989 | Japan. |
| 1-57671 | 3/1989 | Japan. |
| WO89/11732 | 11/1989 | WIPO. |

OTHER PUBLICATIONS

Fu et al., "On the Failure Mechanism of Titanium Nitride/Titanium Silicide Barrier Contacts Under High Current Stress," 8093 *IEEE Transactions on Electron Devices*, vol. 35, No. 12, pp. 2151–2159.

Minami et al., "A New Soft–Error–Immune Static Memory Cell Having a Vertical Driver MOSFET with a Buried Source for the Ground Potential," *IEEE Transactions on Electron Devices*, vol. 36, No. 9, pp. 1657–1662.

(List continued on next page.)

*Primary Examiner*—Mark V. Prenty
*Attorney, Agent, or Firm*—Skjerven, Morrill, MacPherson, Franklin & Friel; Michael Shenker

[57] ABSTRACT

An MOS transistor for use in an integrated circuit is fabricated with a self-aligning contact and interconnect structure which allows for higher packing density. Self-aligning source and drain contacts overlap the gate but are prevented from a short circuiting to the gate by oxide insulation between the source/drain contacts and the gate, and a layer of silicon nitride above the gate. Contacts to the gate are made on top of the gate over the active region of the transistor because the source and drain regions are protected by a hardened layer of photoresist during etching of insulation to expose the gate contact. Source, drain and gate contacts are protected by a layer of titanium silicide so that interconnects are not required to completely cover these areas. Low resistance interconnects are formed of doped polysilicon covered by titanium silicide encapsulated by a thin film of titanium nitride.

13 Claims, 12 Drawing Sheets

U.S. PATENT DOCUMENTS

| | | | |
|---|---|---|---|
| 4,466,176 | 8/1984 | Temple | 29/571 |
| 4,470,852 | 9/1984 | Ellsworth | 148/1.5 |
| 4,518,629 | 5/1985 | Jeuch | 156/643.1 |
| 4,605,470 | 8/1986 | Gwozdz et al. | 156/643 |
| 4,631,806 | 12/1986 | Poppert et al. | 29/589 |
| 4,635,347 | 1/1987 | Lien et al. | 29/591 |
| 4,654,113 | 3/1987 | Tuchiya et al. | 156/643 |
| 4,657,629 | 4/1987 | Bigelow | 156/643.1 |
| 4,746,219 | 5/1988 | Holloway et al. | 357/23.11 |
| 4,772,571 | 9/1988 | Scovell et al. | 437/200 |
| 4,774,203 | 9/1988 | Ikeda et al. | 437/52 |
| 4,774,204 | 9/1988 | Havemann | 437/54 |
| 4,775,550 | 10/1988 | Chu et al. | 427/38 |
| 4,783,238 | 11/1988 | Roesner | 156/649 |
| 4,822,749 | 4/1989 | Flanner et al. | 437/41 |
| 4,826,781 | 5/1989 | Asahina et al. | 437/41 |
| 4,849,369 | 7/1989 | Jeuch et al. | 437/43 |
| 4,851,361 | 7/1989 | Schumann et al. | 437/30 |
| 4,855,798 | 8/1989 | Inamura et al. | 357/44 |
| 4,868,138 | 9/1989 | Chan et al. | 437/44 |
| 4,873,204 | 10/1989 | Wong et al. | 437/200 |
| 4,877,755 | 10/1989 | Rodder | 437/200 |
| 4,882,297 | 11/1989 | Blossfeld | 437/200 |
| 4,886,765 | 12/1989 | Chen et al. | 437/200 |
| 4,920,037 | 4/1990 | Wei et al. | 437/200 |
| 4,937,657 | 6/1990 | DeBlasi et al. | 357/71 |
| 4,939,105 | 7/1990 | Langley | 437/228 |
| 4,944,682 | 7/1990 | Cronin et al. | 437/192 |
| 4,946,550 | 8/1990 | Van Laarhoven | 156/643 |
| 4,960,729 | 10/1990 | Orbach et al. | 437/101 |
| 4,966,864 | 10/1990 | Pfiester | 437/191 |
| 4,977,100 | 12/1990 | Shimura | 437/44 |
| 4,978,637 | 12/1990 | Liou et al. | 437/193 |
| 4,980,020 | 12/1990 | Douglas | 156/643 |
| 4,985,744 | 1/1991 | Spratt et al. | 357/43 |
| 4,996,167 | 2/1991 | Chen | 437/40 |
| 5,013,686 | 5/1991 | Choi et al. | 437/194 |
| 5,023,204 | 6/1991 | Adachi et al. | 437/228 |
| 5,070,037 | 12/1991 | Leisure et al. | 437/195 |
| 5,089,865 | 2/1992 | Mitsui et al. | 257/900 |
| 5,359,226 | 10/1994 | DeJong | 257/393 |

OTHER PUBLICATIONS

"Self-Aligned Technique Employing Planarized Resist for Reducing Polysilicon Sheet Resistance by Formation of a Metal Silicide," 700 IBM Technical Disclosure Bulletin 30 (1987) Oct., No. 5, pp. 55–56. (Armonk, NY, USA).

Kusters et al., "Self-Aligned Bitline Contact for a 4 MBIT Dram," 1046B Extended Abstracts 87–1 (1987), pp. 289–290, Spring No. 1, (Philadelphia, PA, USA).

Yamanaka et al., "A 25 $\mu m^2$, New Poly–Si PMOS Load (PPL) SRAM Cell Having Excellent Soft Error Immunity," *IEDM 1988*, pp. 48–51.

Wolf et al., *Silicon Processing for the VLSI Era*, vol. 1: Process Technology, Lattice Press 1986, pp. 384–388, 423–454.

SELF-ALIGNING CONTACT AND INTERCONNECT STRUCTURE

CROSS-REFERENCE TO RELATED APPLICATIONS

This application is a continuation of application Ser. No. 07/953,410 filed Sep. 28, 1992 (now U.S. Pat. No. 5,483, 104), which is a division of application Ser. No. 07/743,008 filed Aug. 9, 1991, now abandoned, which is a continuation-in-part of application Ser. No. 07/555,559 filed Jul. 19, 1990 (now U.S. Pat. No. 5,124,774), which is a continuation-in-part of application Ser. No. 07/464,496 filed Jan. 12, 1990 (now U.S. Pat. No. 5,166,771). The present application incorporates by reference the above-mentioned applications Ser. No. 07/555,559 and Ser. No. 07/464,496.

This application is related to and incorporates by reference application Ser. No. 07/464,094 filed Jan. 12, 1990, now U.S. Pat. No. 5,172,211 issued on Dec. 15, 1992 and entitled "High Resistance Polysilicon Load Resistor."

BACKGROUND OF THE INVENTION

1. Field of the Invention

This invention relates to a self-aligning contact and an interconnect structure, and method for making the same, for use in integrated circuits. The invention has broad applicability in both memory and logic products.

2. Description of Related Art

An MOS transistor includes a source region, a drain region and a channel region therebetween. In the prior art, electrical contacts to the source and drain regions must be sufficiently spaced from the gate of the transistor to ensure that the source, drain and gate remain electrically isolated when manufacturing tolerances are taken into account. The spacings between the contacts to the source and drain regions, on the one hand, and to the gate on the other hand, are a function of the alignment and critical dimensions such that under worst case manufacturing tolerances, the contacts do not touch the polysilicon gate. Consequently, the surface area of each MOS transistor must be larger than required by the size of the source, drain and gate regions.

A previous method of establishing self-aligned contacts involved oxidizing the polycrystalline silicon gate at a high temperature to provide insulation between the contacts and the gate. Such an approach has been disclosed by J. A. Hayes in U.S. Pat. No. 4,103,415, issued Aug. 1, 1978. However, the temperatures associated with forming oxidation barriers cause diffusion of the dopants in the source and drain regions. This diffusion changes the dimensions of the source and drain regions and thus prevents this approach from being used when integrated circuits are fabricated using one micron and sub-micron fine line geometries. In addition, high temperature oxidation according to prior art self-aligning contact schemes causes oxide to grow along the outer edge of the interface between the gate and the gate oxide, effectively increasing the thickness of the gate oxide in that area. Consequently, the threshold voltage of the transistor will be higher along the edge of the gate than along its center. Thus, the current drive of the transistor will be significantly reduced. Accordingly, there has been need for a new contact structure which would allow the size of the transistors, and therefore the size of memory cells using these transistors, to be reduced.

In an integrated circuit the contacts are usually connected to electrical interconnections or "interconnects" to form an integrated circuit. Interconnects have often been formed using heavily doped polycrystalline silicon (i.e. "polysilicon") layers; however, these layers typically have a sheet resistance of 20 ohms per square or higher. Resistance this high causes long RC time constants and hence, undesirable time delays.

When forming an interconnect layer according to the prior art, the polysilicon interconnect layer is required to overlap all the source, drain and polysilicon contacts so that even in the event of worst case alignment, contacts are not exposed. Such exposure will cause the underlying polysilicon gate and the doped source and drain regions to be damaged during etching of the polysilicon interconnect layer. This alignment requirement of the polysilicon interconnect layer consumes a significant amount of space, particularly in memory cells. Accordingly, there has been a need for low resistance interconnects that are not required to completely overlap the source, drain and polysilicon contacts.

SUMMARY OF THE INVENTION

In accordance with this invention, a self-aligned contact structure is provided which allows for higher packing density (i.e. more transistors per unit area) of integrated circuits compared to the prior art without forcing the production process to finer line geometries and higher costs. The self-aligning structure of this invention is universally applicable to MOS memory and logic integrated circuits and is particularly useful in static random access memory (SRAM) cells which require as many as five contacts per cell.

The self-aligning source and drain contacts in one embodiment of this invention overlap the gate electrode and yet do not cause a short circuit between the source and drain on the one hand and the gate on the other hand. This overlapping also allows for a looser alignment tolerance requirement in the photolithographic operations by which the transistor is made and provides a transistor approximately 30% smaller in size than in the prior art. The overlapping is permissible due to insulation between the gate and the source-drain contacts. The insulation, in one embodiment, is formed of silicon nitride and silicon dioxide. The silicon dioxide layer is formed by low temperature chemical vapor deposition at 350°–400° C. rather than thermally grown at higher temperatures. After the source and drain regions are formed, a minimum of high temperature processes are used, thereby avoiding significant diffusion of dopants in those regions.

In accordance with this invention, contacts to the polysilicon gate can be made on top of the gate region over the active channel because the source and drain regions are protected by a hardened layer of photoresist during etching of the insulation to expose the gate contact. This allows a reduction in the size of the field region of the device which saves Valuable silicon area and allows a higher packing density to be obtained in a given integrated circuit. Considerable space is saved in the vertical direction by forming contacts to the gate region over the active portion of the transistor rather than on top of the thicker field oxide. Furthermore, the contact size of the mask can extend beyond the polysilicon gate, permitting a looser alignment tolerance in the manufacturing process while at the same time achieving, somewhat paradoxically, a smaller transistor area.

In one embodiment of this invention a layer of titanium silicide covered by a thin film of titanium nitride is formed on the exposed source, drain and polysilicon gate contacts. The silicided areas are formed only in selected locations. Interconnects formed from the first deposited layer of polysilicon (the layer from which the gate is formed), and usually located in the periphery of a memory array, are converted to titanium silicide encapsulated by a thin layer of titanium nitride to create low resistance interconnects. The low sheet resistance of the silicided interconnects, typically 3–5 ohms per square, reduces the RC time constant, and hence, the propagation time delay compared to the prior art.

A second layer of polysilicon is deposited and defined to form local interconnects. The etchant used to define the local interconnects will not attack the exposed underlying silicided source, drain and gate contacts and interconnects. Therefore, the polysilicon local interconnect layer is not required to completely cover and protect the source, drain and gate contacts and interconnects, permitting a looser alignment tolerance and saving significant space, particularly in a memory cell.

After the polysilicon local interconnects are defined, they are at least partially converted to titanium silicide and encapsulated by a thin film of titanium nitride. Titanium nitride is a good electrical conductor but is a barrier to dopant diffusion.

The local interconnect layer can cross over the polysilicon gate as well as the N and P doped regions and be isolated from them. The local interconnects can also contact either N or P doped areas as well as silicided polysilicon above the gate or field region, thus allowing for a very flexible local interconnect system.

In one embodiment, the local interconnect layer is formed of doped polysilicon covered by titanium silicide. The doped polysilicon has a low resistivity. The polysilicon is deposited by low pressure chemical vapor deposition (LPCVD). Titanium silicide by contrast, is formed using sputtering. Because the LPCVD provides a good step coverage, the doped polysilicon provides a low resistance on steps on which titanium silicide may fail.

Further, the polysilicon is a good etch stop for some oxide or borophosphosilicate glass (BPSG) etches. Thus the same layer that provides local interconnects is also used to protect the gates when additional contacts to respective sources or drains are etched through a thick BPSG layer. Namely, after the self-aligning contact opening to the source or the drain is made, the source/drain is covered by the doped polysilicon/$TiSi_2$ plate formed from the same layer as the local interconnects. This plate overlaps, but not electrically contacts the adjacent gate. Then a thick BPSG layer is deposited, and an additional contact opening is etched through the BPSG to the source/drain. The contact opening overlaps the gate. The polysilicon/$TiSi_2$ plate is exposed to the contact etch. However, the etch is highly selective to polysilicon. The plate thus acts as an etch stop preventing an electrical short between the contact and the gate.

In one embodiment, the local interconnects and the plate are formed from tungsten silicide. The tungsten silicide is deposited by CVD. The CVD provides a good step coverage. Further, tungsten silicide is a good etch stop for some oxide and BPSG etches.

Other materials that provide a good step coverage and an etch stop for oxide and BPSG etches are used for local interconnects and plates in other embodiments.

Other embodiments and variations of the invention are described below.

DETAILED DESCRIPTION OF THE INVENTION

Figure 1:
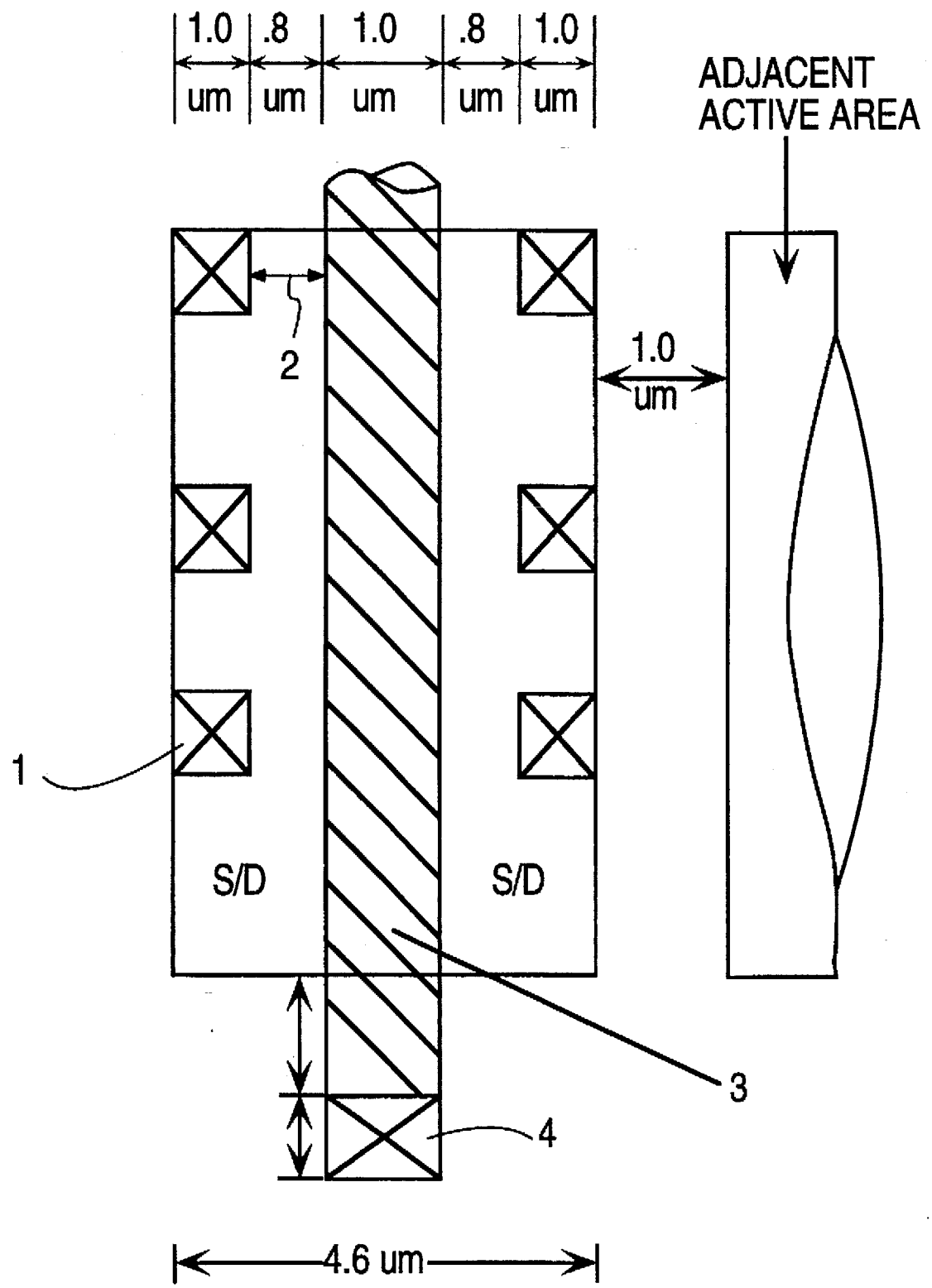
FIG. 1 is a plan view of a conventional MOS transistor structure with contacts formed as in the prior art.
Figure 2A:
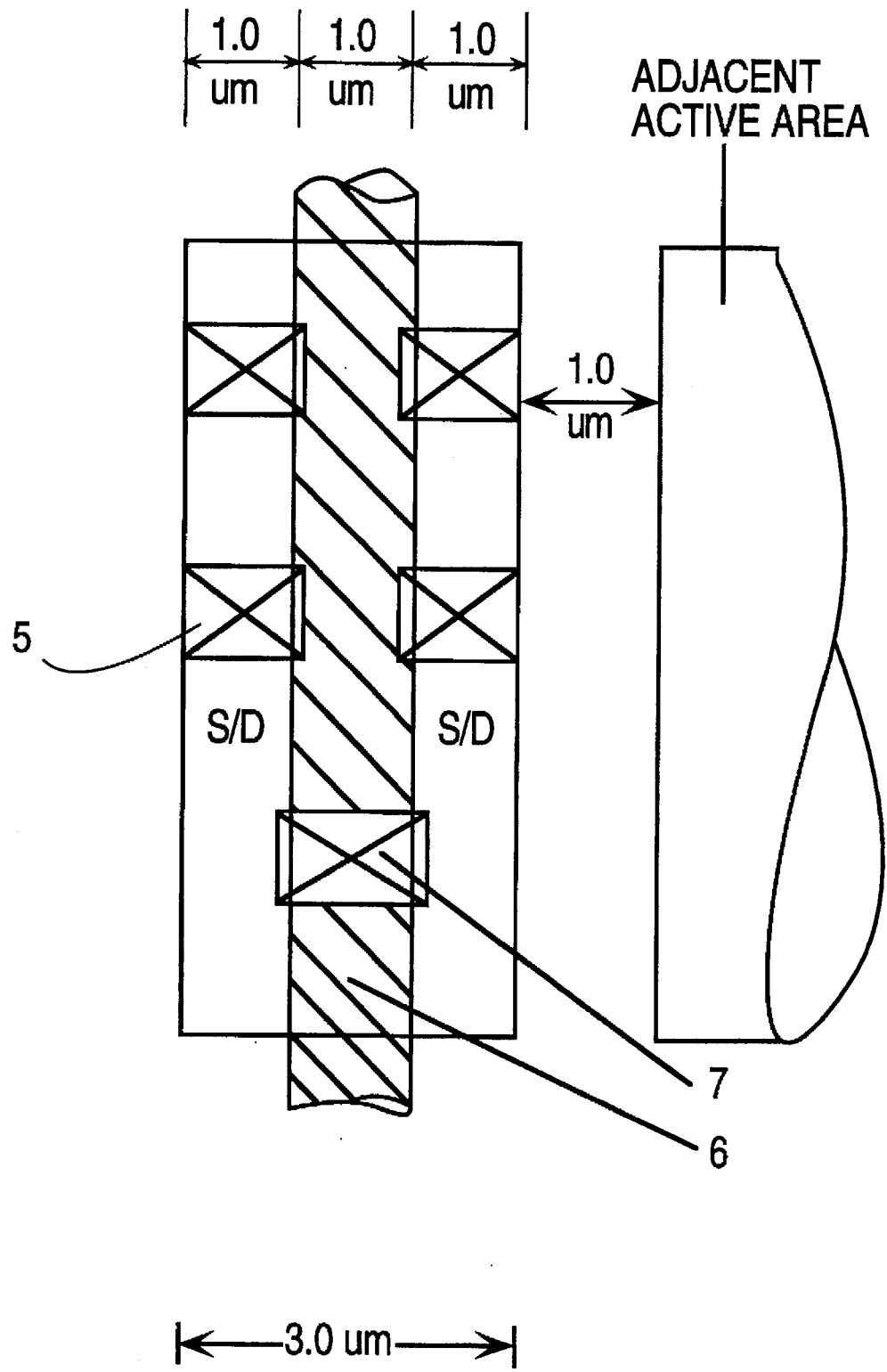
FIG. 2a is a plan view of a MOS transistor structure formed with self-aligning contacts according to this invention.

FIG. 1 illustrates in plan view a prior art MOS transistor having non-self-aligned source/drain contacts 1 and gate contact 4. Using state of the art steppers, the space 2 which assures that the source/drain contacts 1 do not touch the gate 3 is typically 0.8 microns. Thus, using one micron layout rules, the transistor pitch in the x-direction is 5.6 microns. The reduction in transistor size that can be achieved according to this invention is illustrated in FIG. 2a. The self-aligning source/drain contacts 5 can be made to overlap the gate 6. Thus, using one micron layout rules, the transistor pitch in the x-direction is 4 microns, approximately 30% smaller than the prior art.

Referring again to FIG. 1, in the prior art, contacts, such as contact 4, to the polysilicon gate are typically allowed only in the field region, spaced 0.8 microns away from the active region in order to avoid shorts to the source and drain regions due to worst case misalignment of masks during the manufacturing process. As illustrated in FIG. 2a, the self-aligning gate contacts 7 of this invention can be made on top of the active region, saving considerable space.

The contacts and interconnects of this invention are illustrated below on the example of a four transistor SRAM cell whose circuit diagram appears in FIG. 2b. The SRAM cell has two cross-coupled pull down transistors 210a and 210b. Gate 14a of transistor 210a is connected to the drain of transistor 210b by an interconnect 27. Gate 14b of transistor 210b is connected to the drain of transistors 210a by another interconnect 27. Load resistors 31 connect the two drains to the $V_{CC}$ line 56. The two drains are connected to respective bit lines 66.1 and 66.2 through respective pass transistors 220a, 220b whose gates are controlled by word line 54.

Figure 3A:
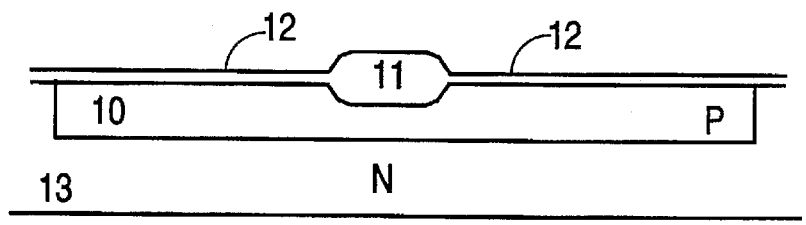
FIGS. 3a through 3k are simplified cross-sectional views of one embodiment of the invention during various steps of fabrication.

FIGS. 3a–3k illustrate the fabrication steps for the cell of FIG. 2a. Referring to FIG. 3a, the fabrication begins using well-known techniques to form a P-well 10, and field and gate oxidation areas 11 and 12 respectively on N-type silicon substrate 13. Gate oxide 12 is typically 180 Å thick.

Figure 3B:
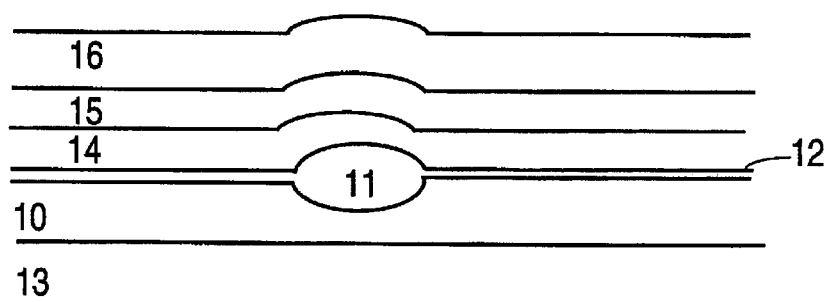

Referring to FIG. 3b, a layer 14 of polysilicon about 3000 Å thick is formed by low pressure chemical vapor deposition (LPCVD) and doped, typically by diffusion, with N-type impurities to achieve a suitable sheet resistance, typically 50 ohms per square. The doped polysilicon will function as a gate in the complete MOSFET devices. First level interconnects (not shown), usually located in the periphery of a memory array, can also be formed from this layer of polysilicon. Next, optionally, a thin, 150 Å oxide layer 15 is thermally grown on the polysilicon. A layer 16 of silicon nitride about 1800 Å thick is next formed on oxide layer 15 by LPCVD.

Figure 3C:
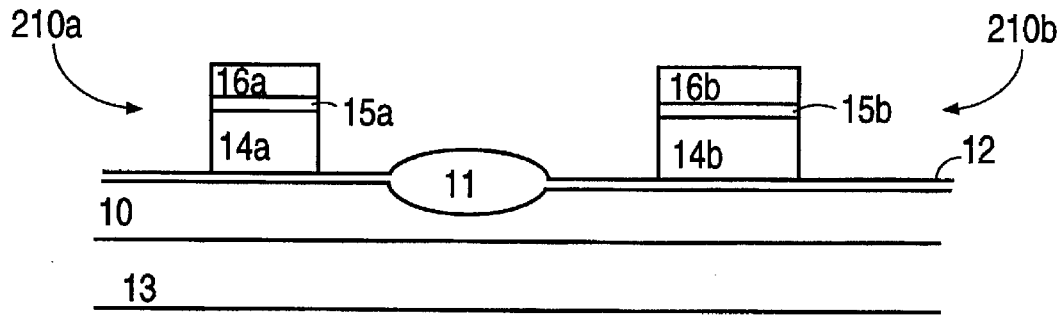

Referring to FIG. 3c, the polysilicon gates 14a, 14b of respective transistors 210a, 210b are defined by well-known photo-masking and sandwich etching techniques. The sandwich etch is carried out in a LAM 490 or LAM 4400 etcher, both available from LAM Research Corporation of Fremont, Calif. The anisotropic sandwich etch includes a $CF_4$ based plasma etch of the silicon nitride layer 16 and silicon oxide layer 15 and a subsequent anisotropic $Cl_2$/He plasma etch of the polysilicon to form polysilicon gates 14a and 14b covered by layers 15a, 15b and 16a, 16b. In a LAM 490 etcher, silicon nitride layer 16 and silicon oxide layer 15 are etched using $CF_4$/$CHF_3$/He. The gas flows are respectively 60 sccm/20 sccm/120 sccm. ("sccm" stands for standard cubic centimeter per minute.) The pressure is 1,950 millitorr. The power is 275 W. The electrode gap is 0.5 cm. The polysilicon is etched in a LAM 490 etcher using $Cl_2$/He. The respective gas flows are 100 sccm/50 sccm. The pressure is 400 millitorr. The power is 275 W. The electrode gap is 0.5 cm. In other embodiments using a LAM 4400 etcher, either an HBr based etch or a $Cl_2$/He etch is used to etch the polysilicon. Other etches are possible.

100 to 200 Å of silicon dioxide (not shown) are thermally grown on the sides of gates 14a and 14b at about 900° C. The thickness of oxide layer 12 increases during this step by about 90 Å.

Figure 3D:
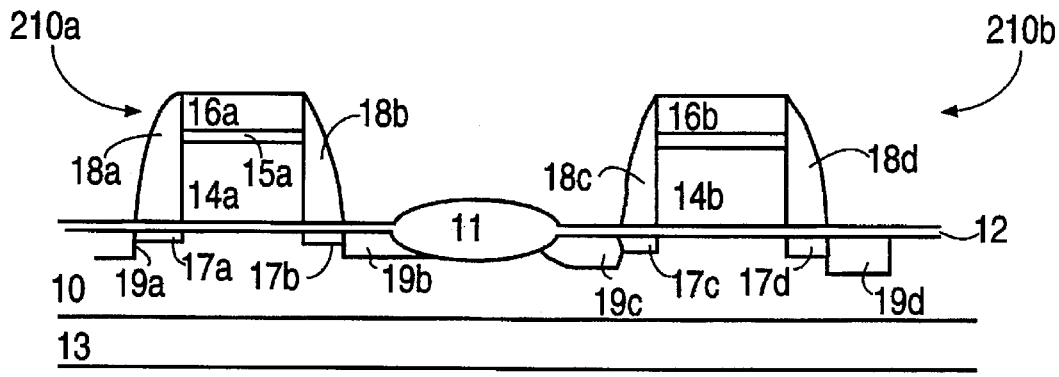

Well known ion implantation techniques are next used to form N-type lightly doped drain (LDD) implants 17a, 17b, 17c, 17d (FIG. 3d). Typically, the impurity concentration of the LDD implants is about $1.8 \times 10^{13}$ dopant atoms per cubic centimeter. Plasma enhanced chemical vapor deposition of a silicon dioxide layer approximately 4000–4200 Å thick using TEOS (tetraethylorthosilicate (ethyl silicate)) at approximately 350°–400° C. followed by reactive ion etching (or another anisotropic etching) forms gate sidewall spacers 18a, 18b, 18c, 18d of silicon dioxide which are approximately 0.25 µm wide. Portions of gate oxide 12 that are not covered by polysilicon gates 14a and 14b or by spacers 18a–d are etched away during this step. Optionally, a layer of oxide 100 Å thick is thermally grown at approximately 800° C. to cap the source and drain regions and to densify the spacer oxide 18a–d. N+ source and drain regions 19a, 19b, 19c, 19d are then formed by well known masked ion implantation so that the dopant concentration is typically $3 \times 10^{15}$–$5 \times 10^{15}$ dopant atoms per cubic centimeter in these regions.

Figure 3E:
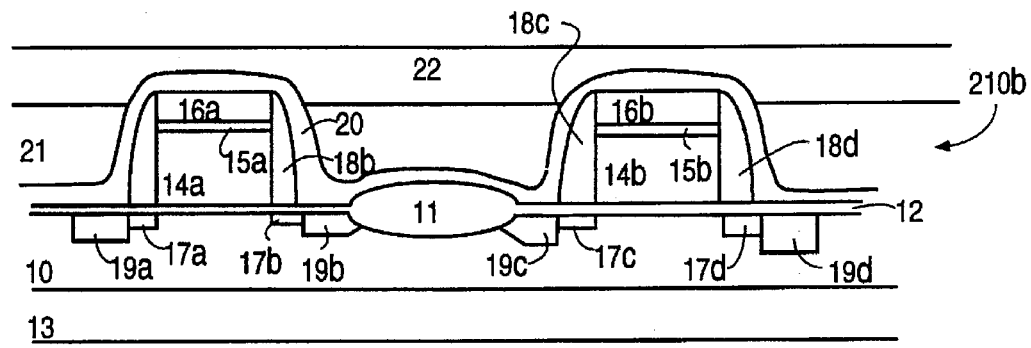
Figure 3F:
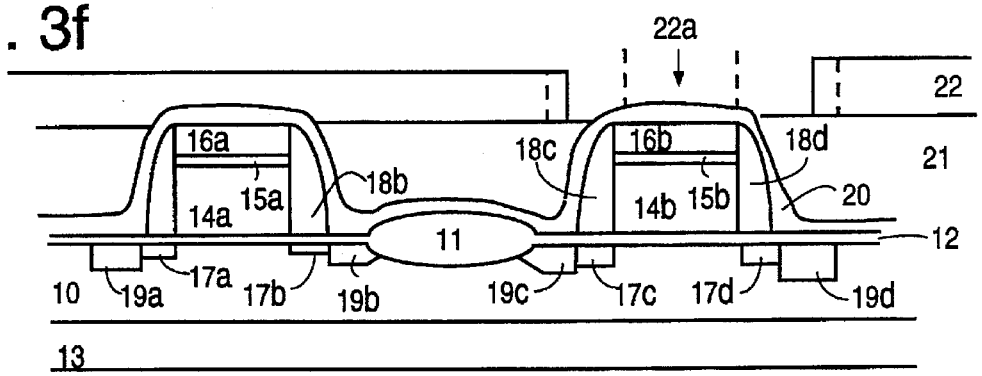
Figure 3G:
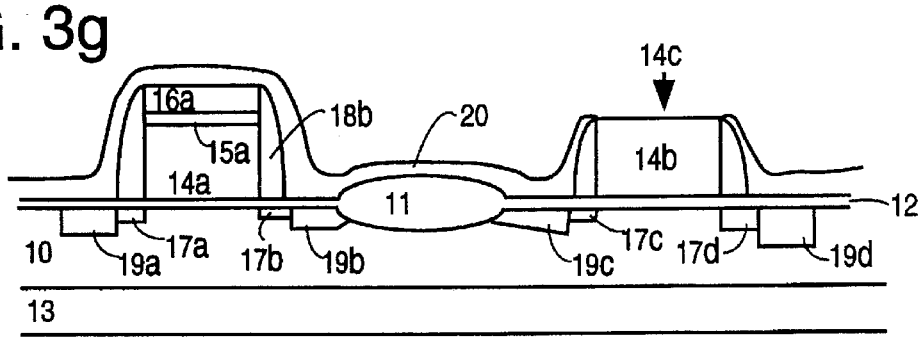

Gate contact regions are defined as described below. Referring to FIG. 3e, chemical vapor deposition of a silicon oxide layer 20, 1500 Å thick, is followed by annealing of the layer at 875° C. for 30 minutes in a nitrogen atmosphere.

The wafer is then coated with a standard Novolak based positive photoresist available from Tokyo Ohka which tends to planarize the wafer, and is then baked. The photoresist 21 is blanket etched by oxygen plasma in an AME 8115 plasma etcher until the oxide 20 covering the gate region is exposed. A second bake of resist layer 21 at 150° C. for approximately 30 minutes hardens the resist 21 and makes it unreactive in subsequent steps. A second layer of the same positive photoresist 22, to be used with a dark field mask, is applied over the first layer 21.

Next an opening is formed through oxide 20, nitride 16b and oxide 15b to allow electrical contact to be made to gate 14b. The polysilicon isolation mask used to expose the gate 14b can have a contact size extending beyond the gate, thereby permitting a looser alignment tolerance. An approximation of the variable position of the contact opening to gate 14a due to alignment tolerances for the mask is shown by the dashed lines in FIG. 3f. The presence of the first photoresist layer 21 prevents exposure of the source and drain regions 19c,d during etching of the oxide layers 20 and 15b and silicon nitride layer 16b to expose the gate 14b, even in the event of worst case alignment of the mask. In this way electrical contact to the gate 14b can be made over the active channel region of transistor 210b without causing a short circuit between the source and drain 19c,d and the gate 14b.

A multi-step etch is conducted to expose the gate contact. First, oxide 20 is removed in the area exposed by the opening 22a in resist layer 22 with a dry plasma etch using $SF_6$/$CHF_3$/He. The respective gas flows are 5 sccm/35 sccm/100 sccm. The power is 500 W. The pressure is 2100 millitorr. The etch is carried out in a TEGAL 903E etcher available from TEGAL Corporation of California. Secondly, the silicon nitride layer 16b is removed by a $CF_4$/$CHF_3$/He plasma etch. The etch is carried out in a LAM 490 etcher in two steps. During the first step, the gas flows are respectively 70 sccm/10 sccm/120 sccm. The pressure is 1650 millitorr. The power is 275 W. The electrode gap is 0.5 cm. During the second step, the parameters are changed so as to make the etch more selective to polysilicon. Namely, the gas flow is 30 sccm/20 sccm/120 sccm, and the pressure is 1950 millitorr. Alternatively, both the oxide and the nitride etches are carried out in a LAM 4500 etcher. In the nitride etch, nitride 16b is etched to end point with a carefully controlled overetch. Oxide layer 15b is removed during the overetch. The nitride etch is selective to polysilicon. This $CF_4$ based process etches the oxide and the nitride at approximately the same rate to help create a smooth profile above gate 14b and causes a small step in the oxide 18c, 18d at the interface of the oxide 18c, 18d and the first layer 21 of photoresist. Next, complete removal of both photoresist layers 21, 22 is performed.

In another embodiment, the self-aligning contact to gate 14b is formed as follows. The wafer is coated with a low viscosity, self-planarizing photoresist 21. The photoresist layer is 3000–6000 Å thick. The top surface of oxide 20 over gate 14b is 1000–2000 Å below the top surface of the resist. The top surface is substantially planar. Photoresist 21 is baked to make it less reactive in subsequent oxide and nitride etching steps.

Then a standard Novolak based positive photoresist 22 available from Tokyo Ohka is applied. The polysilicon isolation mask as the one described above is used to form an opening in photoresist 22. The opening can extend beyond gate 14b. The resist 21 in the opening is etched until oxide 20 over gate 14b is exposed. The resulting structure appears in FIG. 3f. Then oxide 20, silicon nitride 16b and oxide 15b are removed as described above in connection with FIGS. 3f and 3g. In this embodiment, the etches of resist 21, oxide 20, nitride 16b and oxide 15b are performed immediately one after another. The etches can be performed in the same etcher. The process is simplified thereby.

Figure 3H:
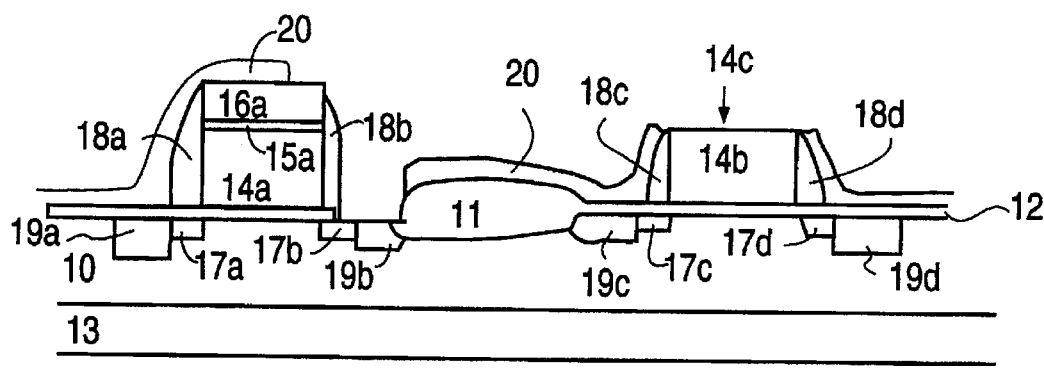

Referring to FIG. 3h, contacts to the source and drain regions are defined using a buried contact mask. An etch of oxide 20 removes only a small portion of spacer oxide 18a, 18b because oxide 20 is relatively thin (1500 Å), the overetch required is minimal (typically about 20%), and the etch is anisotropic. In one embodiment, a 1:1 $C_2F_6$/$CHF_3$ plasma etch is used. Other etch chemistries are possible using TEGAL 903E or LAM 4500 etchers. The silicon nitride layer 16a protects the gate 14a after some portion of the oxide 20 covering the gate is removed. With spacer oxide 18a, 18b and protective silicon nitride layer 16a intact on gate 14a, contacts that overlap the gate can be made to the source or drain 19b without causing a short circuit between the source or drain 19b and the gate 14a.

The oxide etch is followed by a backside etch which exposes pure silicon on the back side of the substrate 10. This exposure allows the temperature of the substrate 10 to be more closely monitored and controlled in subsequent processing steps. The backside etch is conducted in a TEGAL 903E etcher in three steps. The first step using a 12:8 ratio of $CHF_3/SF_6$ in helium is followed by a second step using only $SF_6$ in helium. The third step uses 20:8 $CHF_3/SF_6$, also in helium. Other etch chemistries are possible using a LAM 490 etcher.

Figure 3I:
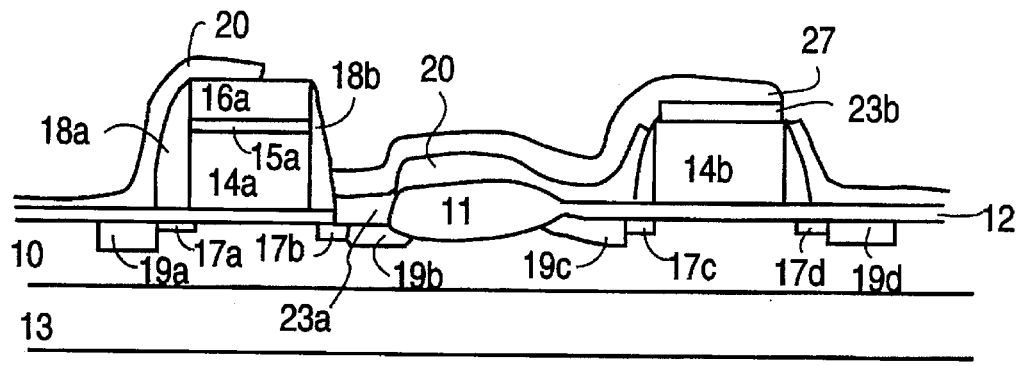

Referring to FIG. 3i, silicide regions 23a, 23b are formed as follows. The silicon exposed by the source, drain and polysilicon gate contacts and the first level polysilicon interconnects (the interconnects are not shown) is silicided by depositing a layer of sputtered titanium about 700 Å thick and using rapid thermal annealing at 700° C. in a $N_2$ atmosphere to form a layer of TiSi coated by a thin layer of titanium nitride. The rapid thermal annealing process involves quickly heating the substrate to a predetermined temperature, holding the substrate at that temperature for 30 seconds and then returning it to its original temperature. The substrate can reach the predetermined temperature as quickly as in 15 seconds. The rapid thermal annealing apparatus typically used is available from PEAK SYSTEMS, model ALP-5500. The unreacted titanium is stripped from the substrate's surface with a 5:1:1 solution of water, hydrogen peroxide and ammonium hydroxide which also attacks and removes the titanium nitride layer. A second rapid thermal annealing step at 900° C. for 30 seconds in an atmosphere of ammonia converts the TiSi to the stable silicide $TiSi_2$ layer 23a, 23b, coated by a thin layer of titanium nitride (not shown). In this way, areas of titanium silicide are selectively formed. For instance, gate 14b is silicided only at regions which will contact the subsequently formed local interconnects because these are the only gate regions exposed by previous processing steps.

Of importance, the silicided layer 23a, 23b can protect the underlying source, drain and gate regions and the first level polysilicon interconnects during later processing steps, particularly the formation of local interconnects to be formed from a second polysilicon layer.

Local interconnects 27 are formed from a second layer of polysilicon about 1200 Å thick which is deposited by LPCVD in a well-known manner. 1000 to 1500 Å thickness is used in some embodiments. Optionally, before the wafers are inserted into the LPCVD reactor, the reactor temperature is lowered to 150° C. In any case, before the wafers are pushed into the reactor the reactor chamber is evacuated and backfilled with an inert gas so as to lessen the wafers' contact with oxygen at high temperatures.

Polysilicon layer 27 is then doped to reduce its resistivity to about 100 to 300 ohms per square. In one embodiment, the dopant is arsenic implanted by ion implantation. The dose is between $1\times10^{15}$ and $5\times10^{15}$ ions/cm$^2$. The energy is between 100 keV and 160 keV. The arsenic implantation is followed by a rapid thermal anneal at 850° C. to 900° C. for 30 to 60 seconds. In another embodiment, polysilicon 27 is doped by phosphine ($PH_3$) in a furnace. The phosphine doping does not require a separate annealing step.

Then well-known masking and etching processes define local interconnects 27. Optionally, a break through step is used to remove native oxide from polysilicon 27 before the polysilicon etch. Use of an isotropic $SF_6$/He plasma etch diminishes the necessity of overetch. Because the etch is selective to titanium silicide, the underlying titanium silicide layer 23a, 23b prevents damage to the source, drain and gate contacts and the first layer interconnects formed from the first polysilicon layer during the etch. Therefore, local interconnects 27 are not required to completely overlap these regions. Layer 23 also acts as an etch stop that protects first layer interconnects so that the etchant will not attack the first layer interconnects during overetching of the local interconnects 27.

Next a 600 Å layer of sputtered titanium is deposited on the substrate. Rapid thermal annealing at 640° C. in a nitrogen atmosphere for 60 seconds forms titanium silicide $TiSi_x$ encapsulated by a thin titanium nitride film on top of the second layer polysilicon. The local interconnects, shown at 27, include polysilicon and the titanium silicide on top. The unreacted titanium and the titanium nitride film are stripped from the surface with a solution of 5:1:1 water, hydrogen peroxide and ammonium hydroxide to provide the structure shown in FIG. 3i.

Figure 3J:
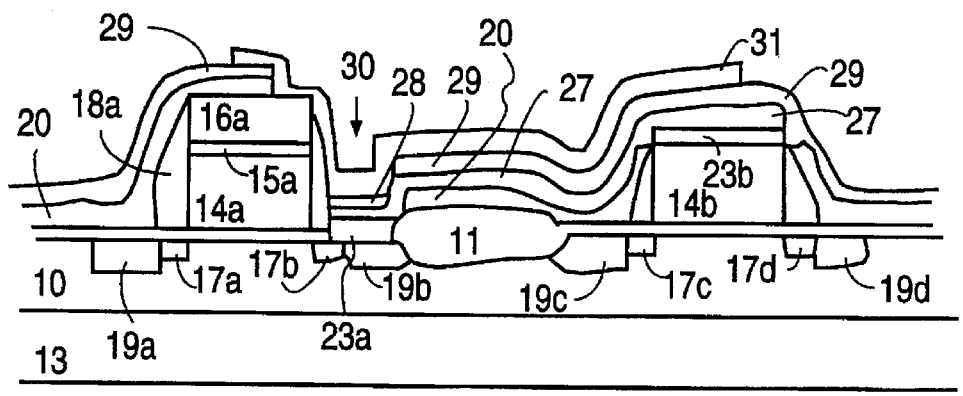

Referring to FIG. 3j, about 500 to 1000 Å of oxide is deposited from a mixture of silane, nitrous oxide and nitrogen at approximately 400° C. to act as an isolation layer 29. Alternatively, TEOS deposition is used. Masking and a standard $CHF_3/O_2$ plasma oxide etch are used to open load resistor vias 30 to selected regions of local interconnects 27. Rapid thermal annealing at 850° C. for 30 seconds in a nitrogen atmosphere converts the $TiSi_x$ of the local interconnects to $TiSi_2$ to create low resistance interconnects. A thin titanium nitride film 28 forms on the regions of the local interconnects exposed by vias 30. Titanium nitride is a good electrical conductor but a barrier to dopant diffusion. This barrier will prevent dopants from diffusing into the polysilicon resistors formed by subsequent processing steps.

In some embodiments, the annealing step that converts $TiSi_x$ to $TiSi_2$ is performed before the deposition of oxide 29. In other embodiments, the annealing step is omitted, and $TiSi_x$ is converted $TiSi_2$ when the to-be-deposited BPSG layer 33 is flowed.

A third layer 31 of polysilicon, 1200 Å thick, which will constitute the resistors, is deposited in a well-known manner by LPCVD. In some embodiments thicknesses between 700 and 1400 Å are used. Masking and an isotropic $SF_6$/He plasma etch define resistors 31 as shown in FIG. 3j. Dopant implantation and/or $Si_3N_4$ encapsulation to control the resistance of the resistors is possible.

Figure 3K:
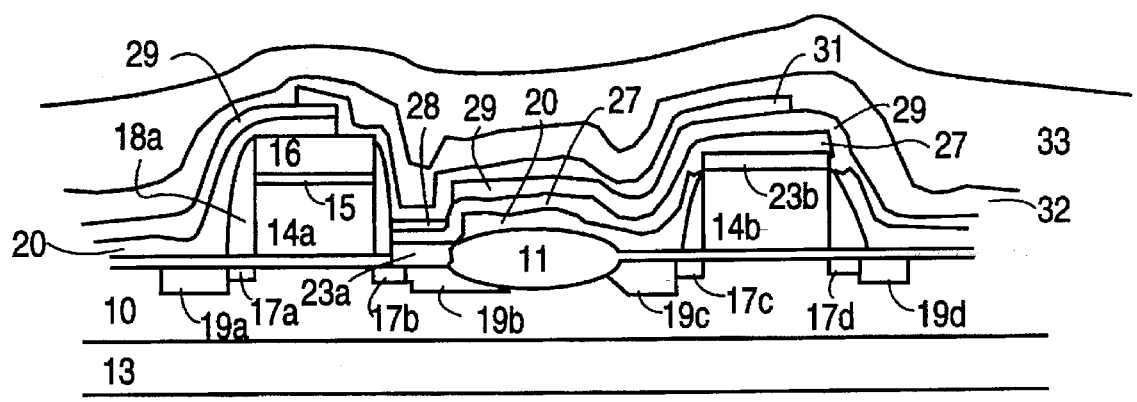

Referring to FIG. 3k, a layer 32 of oxide, 1200–1500 Å thick, is deposited from a mixture of silane, nitrous oxide and nitrogen at approximately 400° C. A doped boronphosphorous glass 33 which acts as an insulation layer is deposited over oxide 32 in a manner similar to oxide 32 but with the addition of diborane and phosphine to the starting gases. Layer 33 is approximately between 5000 and 7000 Å thick. The glass 33 is flowed at 800° C. to 850° C. for about 30 minutes to form a more level surface. Oxide layer 32 prevents diffusion of boron and phosphorus from boronphosphorus glass 33 to resistors 31.

Standard fabrication techniques are used to complete the product.

Figure 4A:
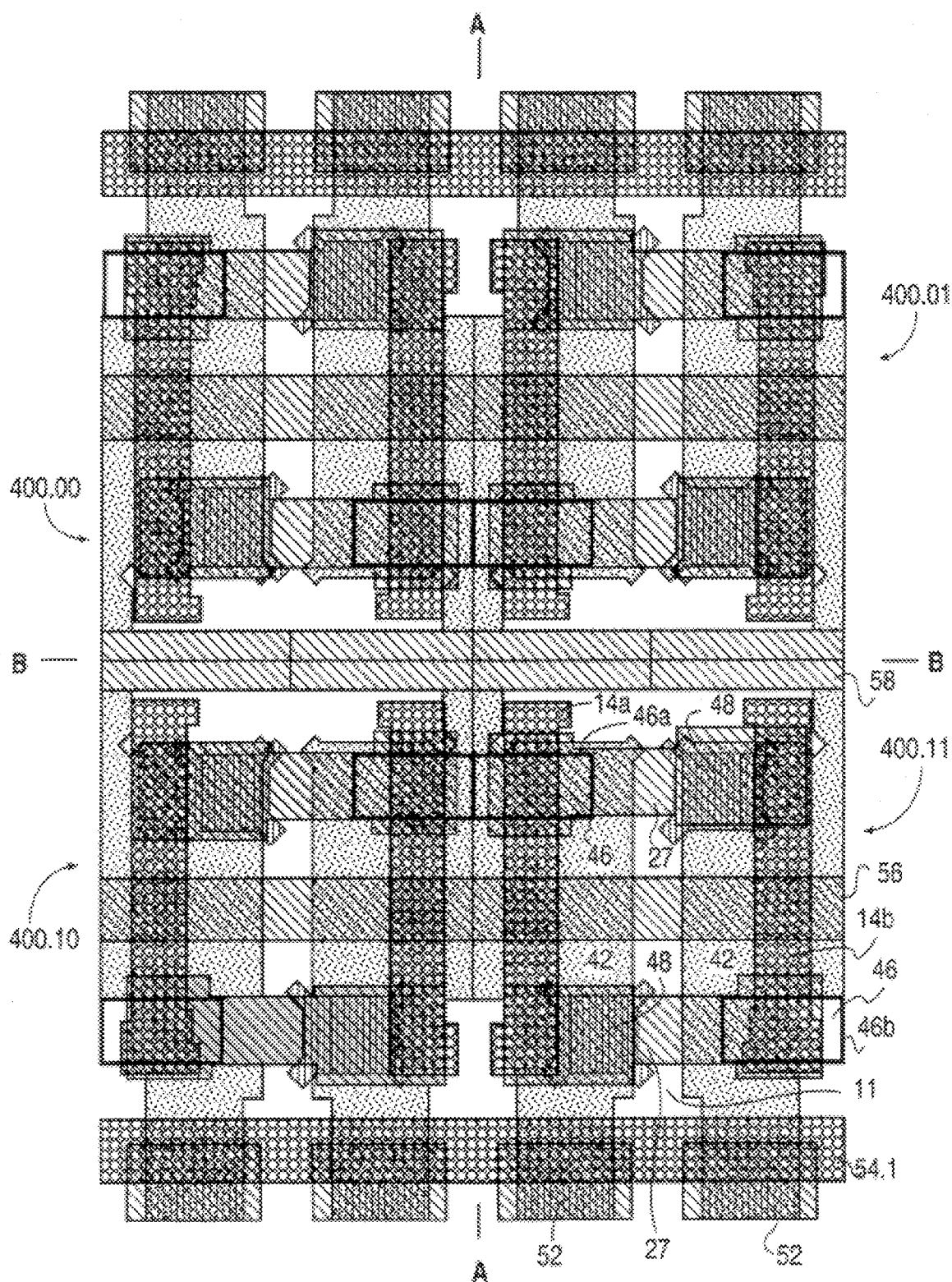
FIGS. 4a and 4b show in plan view the layout of a four cell CMOS 100 SRAM memory using this invention.
Figure 4B:
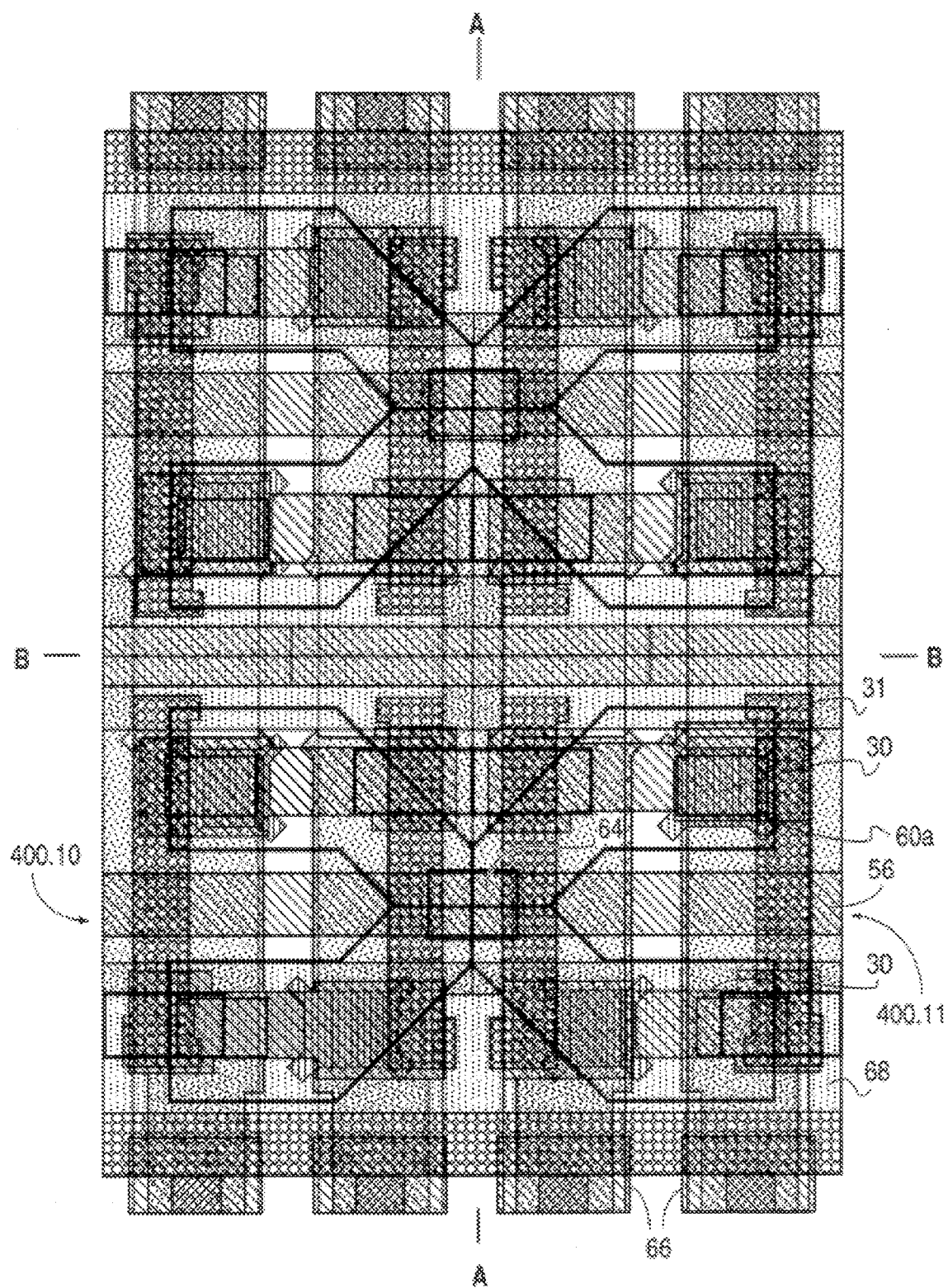

FIGS. 4a and 4b show the layout of a four cell CMOS 100 SRAM memory using this invention. A key illustrating which materials are symbolized by which shading types is also provided as FIG. 4c. Referring to FIG. 4a, which shows only some of the cell components for clarity, each cell occupies one quadrant as divided along lines A—A and B—B. Cells 400.00, 400.10, 400.01 and 400.11 are shown. The cell dimensions, only 6×9 microns, illustrate the small cell size achievable according to this invention. Reference numbers 11 and 42 indicate the field oxide and the island or active areas, respectively. Areas 42 correspond to areas 17b,c and 19b,c in FIGS. 3d–3k. Two conductive gates 14a,b of each cell are formed from the first deposited layer of polysilicon. Contacts 46 to gates 14a,b are formed as the contact to gate 14b in FIG. 3g. Contacts 46 can be wider than the gates 14a,b themselves as indicated by the hash lines 46a. Buried contacts 48 to the source and drain regions are formed as the contact to source or drain 19b in FIGS. 3h–3k. Buried contacts 48 can overlap but not electrically and ohmically contact gates 14a,b. To form the crosscoupled memory cell the circuit for which is shown as FIG. 2b, each buried contact 48 is connected to a gate contact 46 via a conductive local interconnect 27. Other components of each cell include the bit line contacts 52, the polysilicon word line 54.1, the silicided $V_{cc}$ line 56 and the silicided ground line 58. See the above-mentioned application Ser. No. 07/555,559, now U.S. Pat. No. 5,124,774.

Additional cell components are illustrated in FIG. 4b. Load resistor vias 30 are located above a buried contact 48 and overlap a gate contact 46 as indicated by the hash lines 60a. The location of the load resistors 31 is indicated by a heavy line. A via 64 to the $V_{cc}$ line 56 is opened between cells 400.10 and 400.11. Vertical heavy lines 66 and horizontal stripes of shading 68 show the location of metal formed by standard techniques.

Figure 4C:
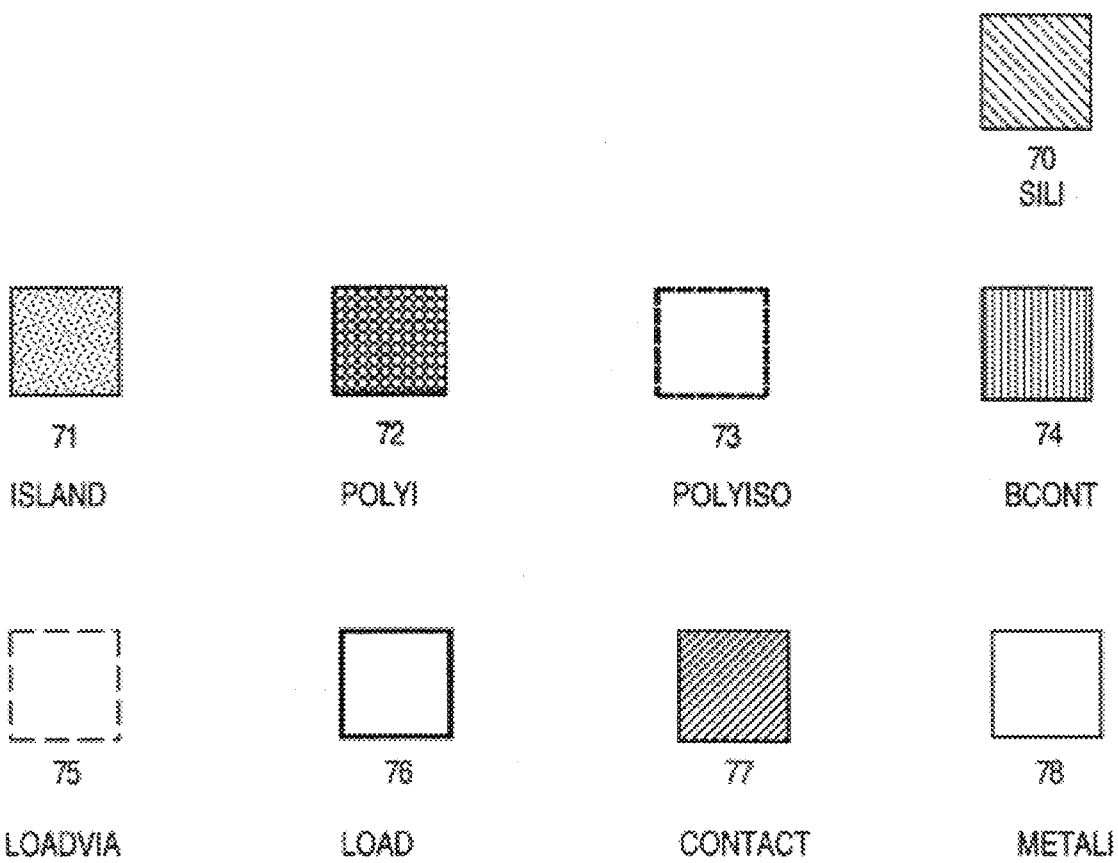
FIG. 4c is a key illustrating which shading types indicate which materials in FIGS. 4a and 4b.

Referring to FIG. 4c, shading 70 indicates titanium silicide layers. Shading 71 indicates an island region. Shading 72 shows cell components formed of polysilicon by the first deposition of polysilicon. Hash lines 73 outline the borders of the polyisolation mask which opens the gate contact. Shading 74 indicates bit contacts. Hash lines 75 outline load resistor vias. Heavy lines 76 outline load resistors. Shading 77 indicates a contact region. Light lines 78 show metallic interconnects. Field oxide in FIGS. 4a and 4b is not shown with shading or outlines but occupies the white unmarked portions of the cell layout.

Figure 5:
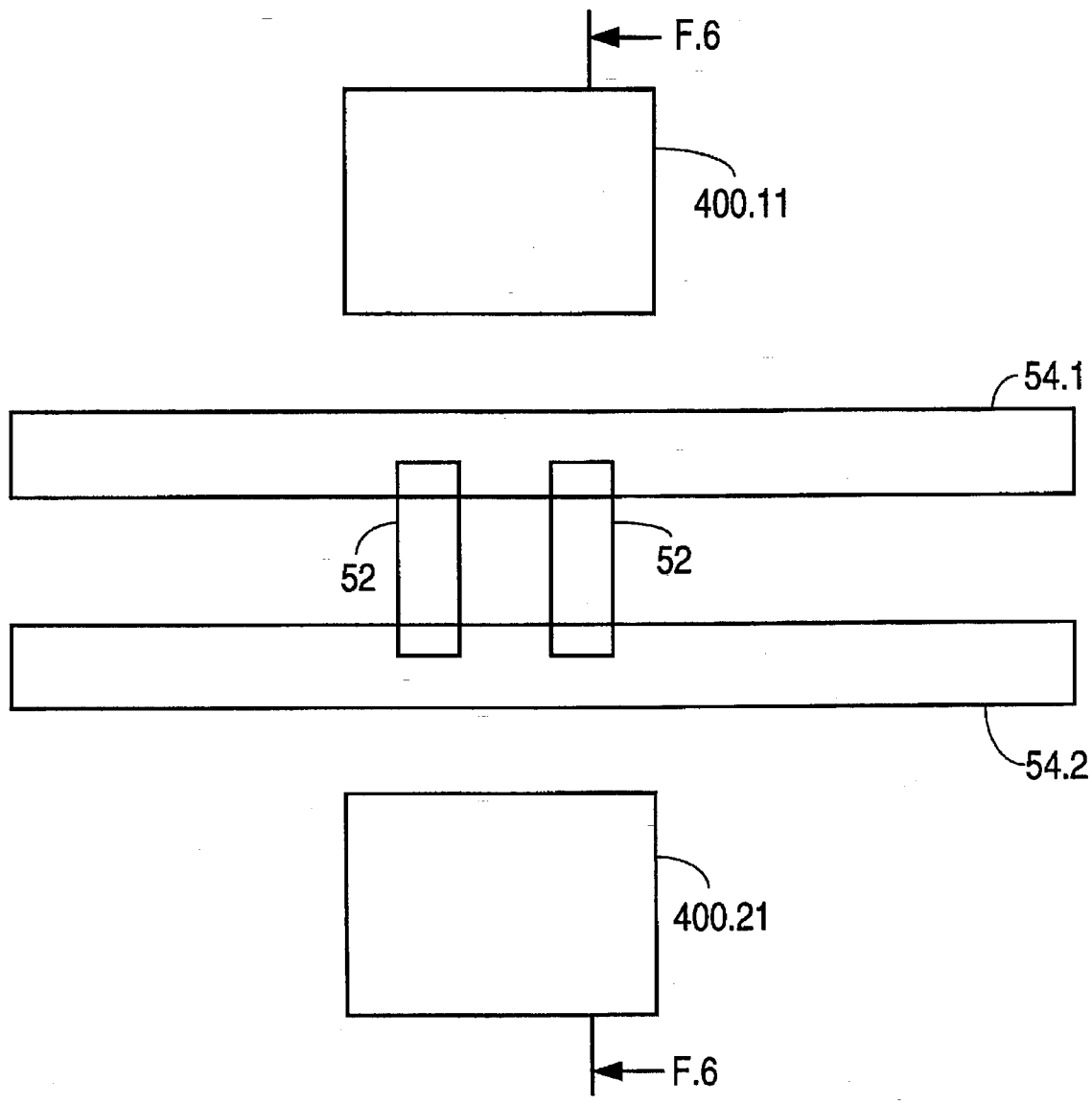
FIG. 5 shows in plan view the layout of a portion of a memory array using this invention.

The array of FIGS. 4a and 4b contains other cells below the cells 400.10 and 400.11 which are a mirror image of cell 400.10 and 400.11. FIG. 5 shows cell 400.21 which is a mirror image of cell 400.11. Cell 400.21 is connected to word line 54.2 which runs parallel to word line 54.1. Complementary bit lines 66 (not shown in FIG. 5) contact the sources of the respective pass transistors through respective contacts 52. Bit lines 66 are formed of metal 1. Contact openings 52 overlie word lines 54.1 and 54.2 that serve as the gates of the respective pass transistors. Bit line 66, however, are electrically isolated from word lines 54.1 and 54.2. Contacts 52 are enabled to overlie word lines 54.1 and 54.2 because of the plates formed from the same layer as the local interconnects 27 as described below.

Figure 6:
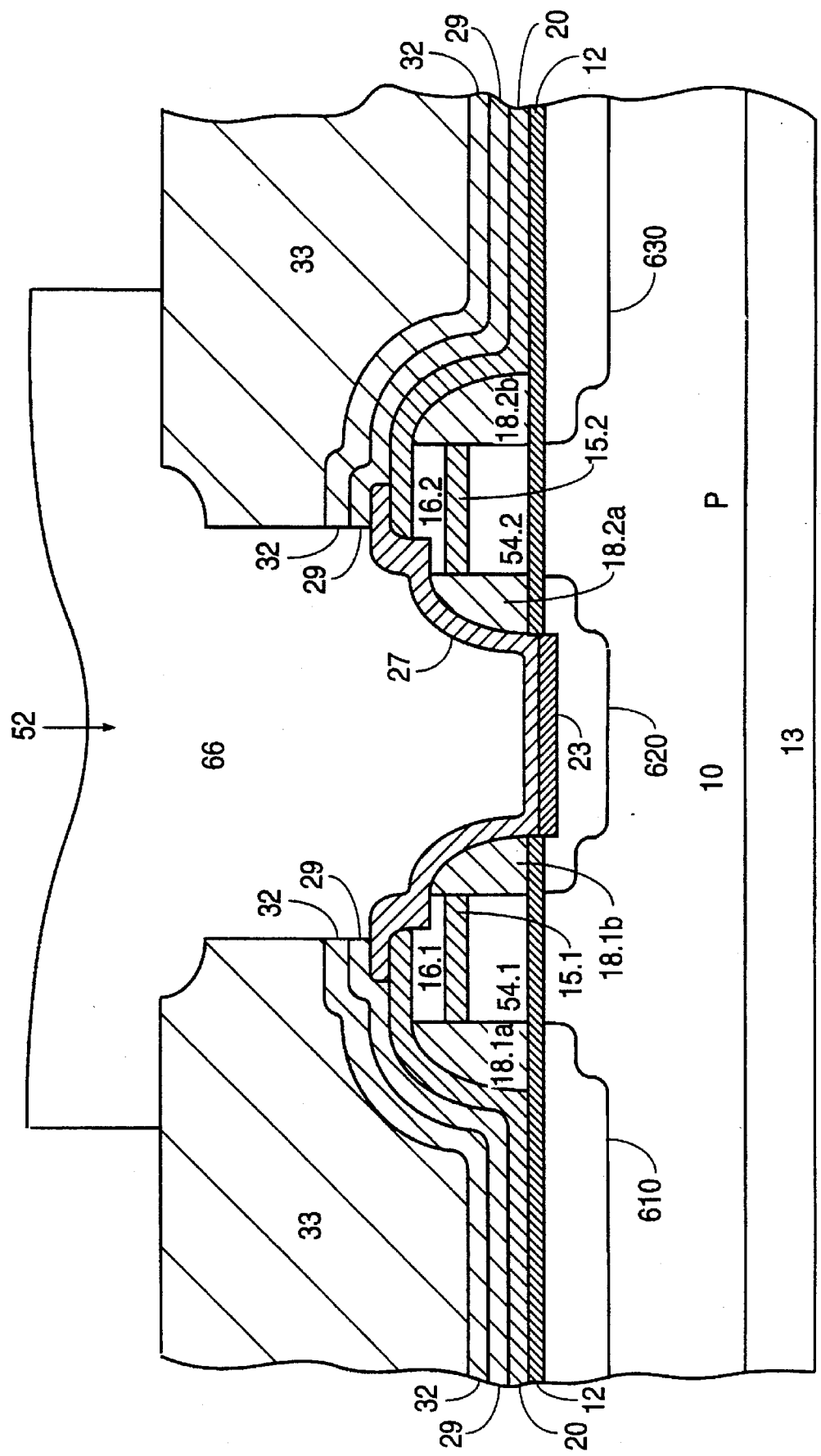
FIG. 6 is a simplified cross-sectional view of the memory array of FIG. 5.

FIG. 6 shows a cross section of the memory array. The cross section is taken along the lines F.6—F.6 in FIG. 5. Only a portion containing the word lines and surrounding regions is shown. FIG. 6 shows substrate 13 and P-well 10. Gates 54.1 and 54.2 of the pass transistors, oxide 15.1, 15.2 and silicon nitride 16.1, 16.2 are formed in the same manner and at the same time as gates 14a,b, oxide 15a,b and silicon nitride 16a,b. See FIGS. 3a–3c. The sides of gates 54.1 and 54.2 are covered by a thermal oxide (not shown) just as the sides of gates 14a,b. Spacers 18.1a, 18.1b and 18.2a, 18.2b are formed with spacers 18a–d (FIG. 3d). Source/drain regions 610, 620 and 630 are formed at the same time and in the same manner as regions 17a–d and 19a–d in FIG. 3d. Oxide layer 20 described above in connection with FIG. 3e covers the structure. A contact to source/drain region 620 is made at the same time and in the same manner as the contact to regions 17b, 19b of FIG. 3h. Silicide region 23 over source/drain 620 is formed at the same time and in the same manner as region 23a in FIG. 3i. Plate 27 consisting of a layer of doped polysilicon covered by a layer of titanium silicide is formed with local interconnects 27 in FIG. 3i. Plate 27 overlaps gates 54.1 and 54.2. Plate 27 will act as an etch stop when contact opening 52 is etched through BPSG layer 33. Plate 27 will protect gates 54.1 and 54.2 during that etch thus enabling opening 52 to overlap gates 54.1 and 54.2.

Oxide layers 29 and 32 and BPSG layer 33 are deposited as described above in connection with FIGS. 3j and 3k.

Then contact opening 52 is etched to provide a contact between bit line 66 and source/drain 620 of the pass transistors of cells 400.11 and 400.21. The etch is performed in two steps in a TEGAL 903E etcher. The gases in both steps are $SF_6/CHF_3$/He. During the first step, the respective gas flows are 8 sccm/20 sccm/100 sccm; the pressure is 2100 millitorr; the power is 650 W. The first step lasts about 20 seconds. During the second step the respective gas flows are 3 sccm/45 sccm/100 sccm; the, pressure is 2000 millitorr; and the power is 600 W. The second step lasts 70 to 100 seconds. The second step etch is more selective to $TiSi_2$, polysilicon and monocrystalline silicon than the first step etch. The first step etch, however, generates less polymer build-up. The two steps combine to provide the desired selectivity with a low overall polymer build-up.

Plate 27 plays an important role in preventing the etch from exposing gates 54.1, 54.2. Indeed, BPSG layer 33 is much thicker than spacers 18.1b and 18.2a, and so the spacers might not by themselves protect gates 54.1 and 54.2. Silicon nitride layers 16.1 and 16.2 do not provide sufficient protection either because the etch does etch silicon nitride, though somewhat slower than BPSG. Since BPSG layer 33 is much thicker than nitride layer 16.1, 16.2, and since some overetch is needed, the etch would etch through silicon nitride 16.1, 16.2 and then oxide 15.1, 15.2 exposing the gates. Fortunately, the polysilicon at the bottom of plate 27 provides a good protection for the gates.

In some embodiments layer 27 is made of tungsten silicide deposited by CVD. Tungsten silicide is also a good etch step for some BPSG etches. In some embodiments, other materials are used for layer 27.

Figure 2B:
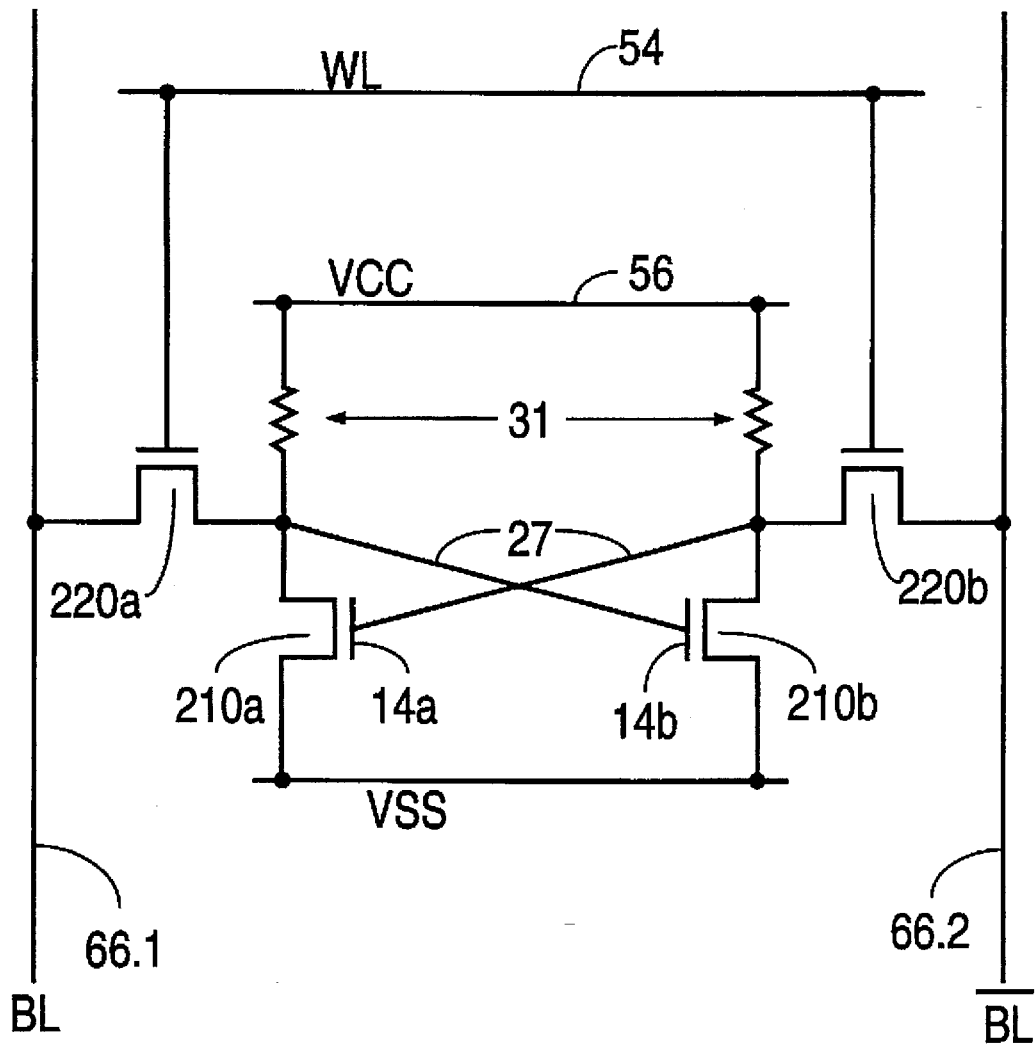
FIG. 2b is a circuit diagram of a memory cell which can be manufactured with contacts and interconnects according to this invention.

Another embodiment of the memory cell of FIG. 2b manufacturable by the process of the present invention is disclosed in the above-mentioned application Ser. No. 07/555,559, now U.S. Pat. No. 5,124,774. That cell has a cross section similar to the cross section of FIG. 3k, except the source/drain contact is made to source/drain 19a rather than 19b, and local interconnect 27 connects gate 14b to source/drain 19a. Local interconnect 27 passes over source/drain 19b without contacting source/drain 19b. In that memory, doped polysilicon/$TiSi_2$ plates 27 are made from the same layer 27 to enable a contact to pass transistor source/drains to overlap the word lines without contacting the word lines.

The present invention is not limited to the embodiments described above. The self-aligning contacts, interconnects such as local interconnect 27, and other features of the invention can be used in many NMOS, PMOS, CMOS circuits and in other technologies. For example, the conductivity types can be switched to obtain other circuits than the circuits described above. Many other embodiments are in the scope of the invention which is defined by the following claims.

We claim:

1. An integrated circuit comprising:
    a transistor having main current-carrying electrodes S and D and a control electrode G which extends up higher than said electrodes S and D, the control electrode G having a top having an edge;
    a first insulator overlying said electrode G;
    a second insulator overlying said electrodes S and G and overlying and contacting said first insulator, the second insulator being formed of a material which can be etched selectively to the first insulator;
    an opening in said first and second insulators to the control electrode G, said opening exposing a part, but not all, of the top of the control electrode G, said opening exposing at least a portion of said top edge of the control electrode G which portion is adjacent to the electrode S, but not exposing said electrode S;
    a terminal spaced from said electrodes S and G; and
    a conductive interconnect immediately above said first and second insulators, for electrically interconnecting said electrode G and said terminal, said interconnect contacting said electrode G through said opening, said interconnect passing over said electrode S but being separated from said electrode S by at least said second insulator, said interconnect comprising a layer of doped polysilicon.

2. The circuit of claim 1 wherein said interconnect further comprises a layer of metal silicide.

3. An integrated circuit comprising:
    a transistor having main current-carrying electrodes S and D and a control electrode G which extends up higher than said electrodes S and D, the control electrode G having a top having an edge;
    a first insulator overlying said electrode G;
    a second insulator overlying said electrodes S and G and overlying and contacting said first insulator, the second insulator being formed of a material which can be etched selectively to the first insulator;
    an opening in said first and second insulators to the control electrode G, said opening exposing a part, but not all, of the control electrode G, said opening exposing at least a portion of said top edge of the control electrode G which portion is adjacent to the electrode S, but not exposing said electrode S;
    a terminal spaced from said electrodes S and G; and
    a conductive interconnect immediately above said first and second insulators, for electrically interconnecting said electrode G and said terminal, said interconnect contacting said electrode G through said opening, said interconnect passing over said electrode S but being separated from said electrode S by at least said second insulator, said interconnect comprising tungsten silicide.

4. The circuit of claim 3 wherein said tungsten silicide is formed by chemical vapor deposition.

5. An integrated circuit comprising:
    a transistor T2 having main current carrying electrodes S2 and D2 and a control electrode G2 which extends up higher than the electrodes S2 and D2, the control electrode G2 having a top and having a sidewall at least a portion of which is adjacent to the electrode S2;
    a first insulator overlying the control electrode G2 but not extending beyond the control electrode G2 over the electrode S2;
    a second insulator overlying the first insulator and the electrodes G2 and S2, the second insulator being formed of a material that can be etched selectively to the first insulator;
    a first opening in the second insulator, the first opening exposing the electrode S2 but not the control electrode G2, the first opening exposing the first insulator over the control electrode G2, the first opening being separated from the sidewall of the control electrode G2 by at least an insulating sidewall spacer;
    a transistor T1 comprising main current-carrying electrodes S1 and D1 and a control electrode G1 which extends up higher than the electrodes S1 and D1, the control electrode G1 having a top having an edge;
    a third insulator overlying the electrodes S1 and G1; and
    a second opening in the third insulator, the second opening exposing a part, but not all, of the top of the control electrode G1, the second opening exposing at least a portion of said top edge of the control electrode G1 which portion is adjacent to the electrode S1, but not exposing the electrode S1.

6. The integrated circuit of claim 5 further comprising a conductive interconnect contacting the electrode S2 through the first opening and the electrode G1 through the second opening, the interconnect being spaced from the electrodes G2 and S1.

7. An integrated circuit comprising:
    a transistor T2 having main current carrying electrodes S2 and D2 and a control electrode G2 which extends up higher than the electrodes S2 and D2, the control electrode G2 having a top and having a sidewall at least a portion of which is adjacent to the electrode S2;
    a first insulator overlying the control electrode G2 but not extending beyond the control electrode G2 over the electrode S2;
    a second insulator overlying the first insulator and the electrodes G2 and S2, the second insulator being formed of a material that can be etched selectively to the first insulator;
    a first opening in the second insulator, the first opening exposing the electrode S2 but not the control electrode G2, the first opening exposing the first insulator over the control electrode G2, the first opening being separated from the sidewall of the control electrode G2 by at least an insulating sidewall spacer; wherein:
    the first insulator does not extend beyond the control electrode G2 over one of the electrodes S2 and D2, and the second insulator overlies said one of the electrodes S2 and D2; and
    the integrated circuit further comprises a second opening in the first and second insulators such that the second opening exposes at least a portion of an edge of the top of the control electrode G2 which portion is adjacent to said one of the electrodes S2 and D2, but the second opening does not expose said one of the electrodes S2 and D2, and the second opening is spaced from the first opening.

8. The integrated circuit of claim 7 further comprising:
    a first conductive interconnect contacting the electrode S2 through the first opening, the first interconnect being spaced from the control electrode G2; and
    a second conductive interconnect overlying said one of the electrodes S2 and D2 and contacting the control electrode G2 through the second opening, the second interconnect being spaced from the first interconnect and from said one of the electrodes S2 and D2.

9. The integrated circuit of claim 7 wherein said one of the electrodes S2 and D2 is the electrode S2.

10. An integrated circuit comprising:

a transistor T2 having main current carrying electrodes S2 and D2 and a control electrode G2 which extends up higher than the electrodes S2 and D2, the control electrode G2 having a top and having a sidewall at least a portion of which is adjacent to the electrode S2;

a first insulator overlying the control electrode G2 but not extending beyond the control electrode G2 over the electrode S2;

a second insulator overlying the first insulator and the electrodes G2 and S2, the second insulator being formed of a material that can be etched selectively to the first insulator;

a first opening in the second insulator, the first opening exposing the electrode S2 but not the control electrode G2, the first opening exposing the first insulator over the control electrode G2, the first opening being separated from the sidewall of the control electrode G2 by at least an insulating sidewall spacer; and a conductive interconnect contacting the electrode S2 through the first opening, the interconnect being spaced from the control electrode G2;

wherein said interconnect comprises tungsten silicide.

11. An integrated circuit comprising:

a transistor T2 having main current carrying electrodes S2 and D2 and a control electrode G2 which extends up higher than the electrodes S2 and D2, the control electrode G2 having a top and having a sidewall at least a portion of which is adjacent to the electrode S2;

a first insulator overlying the control electrode G2 but not extending beyond the control electrode G2 over the electrode S2;

a second insulator overlying the first insulator and the electrodes G2 and S2, the second insulator being formed of a material that can be etched selectively to the first insulator;

a first opening in the second insulator, the first opening exposing the electrode S2 but not the control electrode G2, the first opening exposing the first insulator over the control electrode G2, the first opening being separated from the sidewall of the control electrode G2 by at least an insulating sidewall spacer;

a conductive interconnect contacting the electrode S2 through the first opening, the interconnect being spaced from the control electrode G2;

a conductive plate overlying and contacting the electrode S2 in the first opening and also overlying the second insulator and underlying and contacting the interconnect;

a third insulator overlying the conductive plate and underlying the interconnect; and an opening OP1 in the third insulator, the opening OP1 exposing the conductive plate, wherein the interconnect contacts the conductive plate through the opening OP1.

12. The integrated circuit of claim 11 wherein the opening OP1 and the conductive plate overlie the control electrode G2.

13. An integrated circuit comprising:

a transistor T2 having main current carrying electrodes S2 and D2 and a control electrode G2 which extends up higher than the electrodes S2 and D2, the control electrode G2 having a top and having a sidewall at least a portion of which is adjacent to the electrode S2;

a first insulator overlying the control electrode G2 but not extending beyond the control electrode G2 over the electrode S2;

a second insulator overlying the first insulator and the electrodes G2 and S2, the second insulator being formed of a material that can be etched selectively to the first insulator; and a first opening in the second insulator, the first opening exposing the electrode S2 but not the control electrode G2, the first opening exposing the first insulator over the control electrode G2, the first opening being separated from the sidewall of the control electrode G2 by at least an insulating sidewall spacer;

wherein each of the electrodes S2, D2 and G2 comprises silicon and metal silicide overlying the silicon.

* * * * *